United States Patent
Chiang et al.

(10) Patent No.: US 10,672,812 B2
(45) Date of Patent: *Jun. 2, 2020

(54) IMAGE SENSOR

(71) Applicant: TAIWAN SEMICONDUCTOR MANUFACTURING CO., LTD., Hsinchu (TW)

(72) Inventors: Wei-Chieh Chiang, Changhua County (TW); Keng-Yu Chou, Kaohsiung (TW); Chun-Hao Chuang, Hsinchu (TW); Chien-Hsien Tseng, Hsinchu (TW); Kazuaki Hashimoto, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/505,487

(22) Filed: Jul. 8, 2019

(65) Prior Publication Data

US 2019/0333950 A1   Oct. 31, 2019

Related U.S. Application Data

(63) Continuation of application No. 15/596,085, filed on May 16, 2017, now Pat. No. 10,347,675.

(60) Provisional application No. 62/475,311, filed on Mar. 23, 2017.

(51) Int. Cl.
   *H01L 27/146* (2006.01)
   *H04N 9/04* (2006.01)
   *H04N 5/369* (2011.01)

(52) U.S. Cl.
   CPC .... *H01L 27/14621* (2013.01); *H01L 27/1464* (2013.01); *H01L 27/14627* (2013.01); *H01L 27/14645* (2013.01); *H04N 5/3696* (2013.01); *H04N 9/04555* (2018.08); *H04N 9/04561* (2018.08)

(58) Field of Classification Search
   None
   See application file for complete search history.

(56) References Cited

U.S. PATENT DOCUMENTS

| | | | |
|---|---|---|---|
| 6,529,239 | B1 | 3/2003 | Dyck et al. |
| 8,350,935 | B2 | 1/2013 | Kim et al. |
| 9,368,530 | B2 | 6/2016 | Tsau et al. |
| 10,347,675 | B2 * | 7/2019 | Chiang |
| 2015/0350582 | A1 | 12/2015 | Korobov et al. |

* cited by examiner

*Primary Examiner* — James M Hannett
(74) *Attorney, Agent, or Firm* — Maschoff Brennan

(57) ABSTRACT

An image sensor includes a color filter array and a light receiving element. The color filter array includes plural repeating unit cells including first, second, and third unit cells. The first and second unit cells are adjacent to each other in a first direction, the second and third unit cells are adjacent to each other in a second direction transverse to the first direction. Each of the first, second, and third unit cells includes at least one first yellow filter configured to transmit a green component and a red component of incident light, and each of the first, second, and third unit cells does not comprise a red filter configured to transmit the red component of the incident light. The light receiving element is configured to convert the incident light transmitted by the color filter array into electric signals.

20 Claims, 10 Drawing Sheets

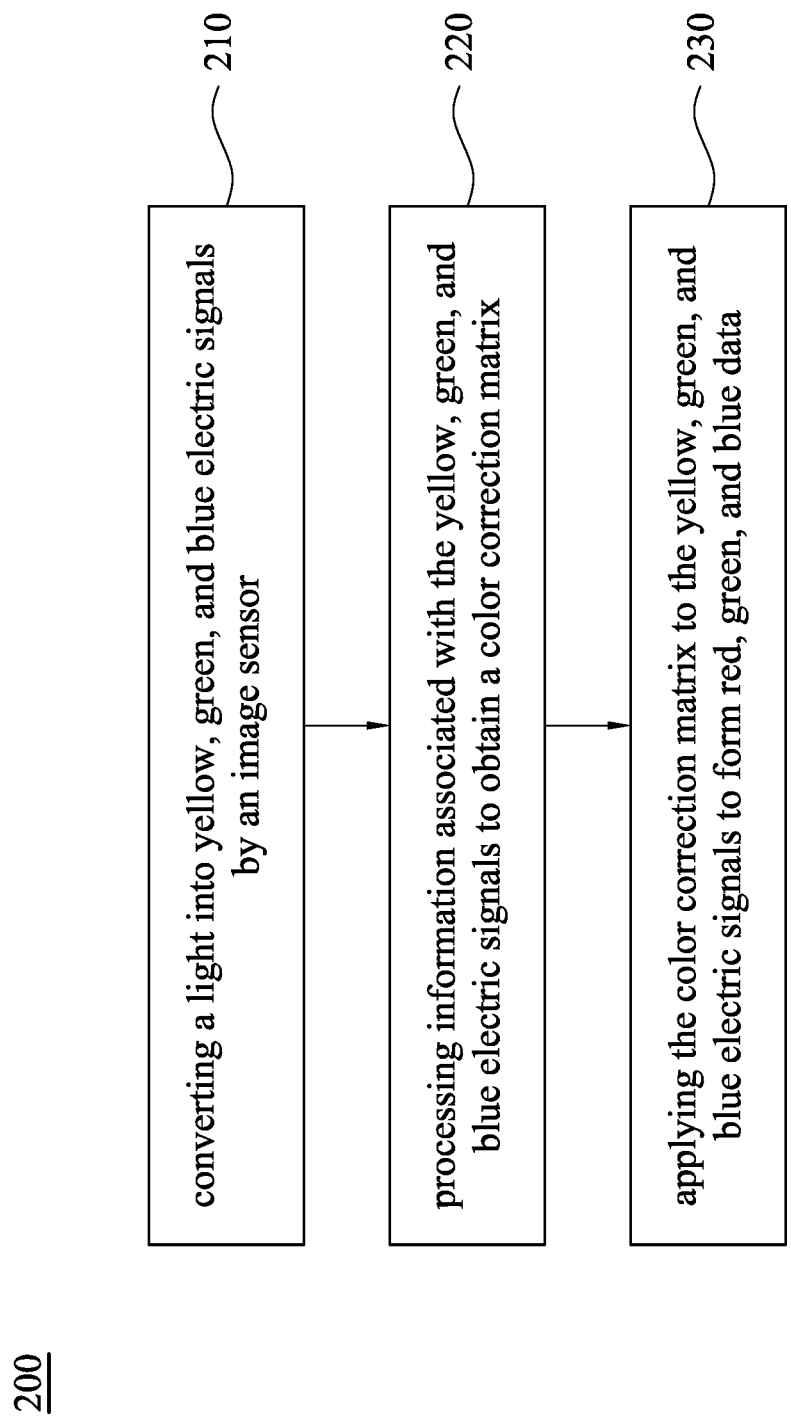

IMAGE SENSOR

PRIORITY CLAIM AND CROSS-REFERENCE

This application is a continuation of U.S. application Ser. No. 15/596,085, filed May 16, 2017, now U.S. Pat. No. 10,347,675, issued Jul. 9, 2019, which claims priority of U.S. Provisional Application Ser. No. 62/475,311, filed Mar. 23, 2017, the entirety of which is incorporated by reference herein in their entireties.

BACKGROUND

The present disclosure relates to image sensors.

Image sensors are commonly used in electronic devices such as cellular telephones, cameras, and computers to capture images. In some arrangements, an electronic device is provided with an array of image pixels arranged in pixel rows and pixel columns. Circuitry is commonly coupled to pixel columns for reading out image signal from the image pixels. Imaging systems employ an image sensor in which the visible light spectrum is sampled by red, green, and blue (RGB) image pixels arranged in a mosaic pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow chart of an image processing method according to some embodiments of the present disclosure.

DETAILED DESCRIPTION

Figure 1A:
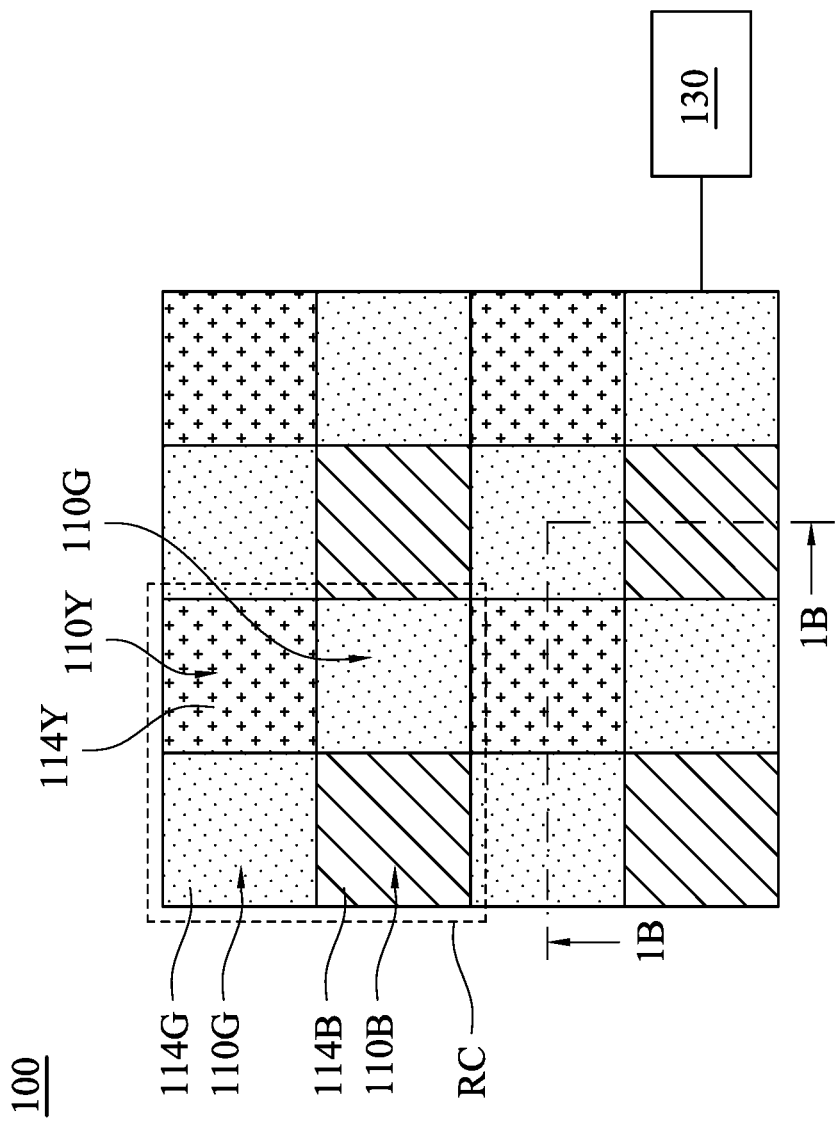
FIG. 1A is a schematic top view of an array of image sensor pixels of an image sensor according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numeral and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or features's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
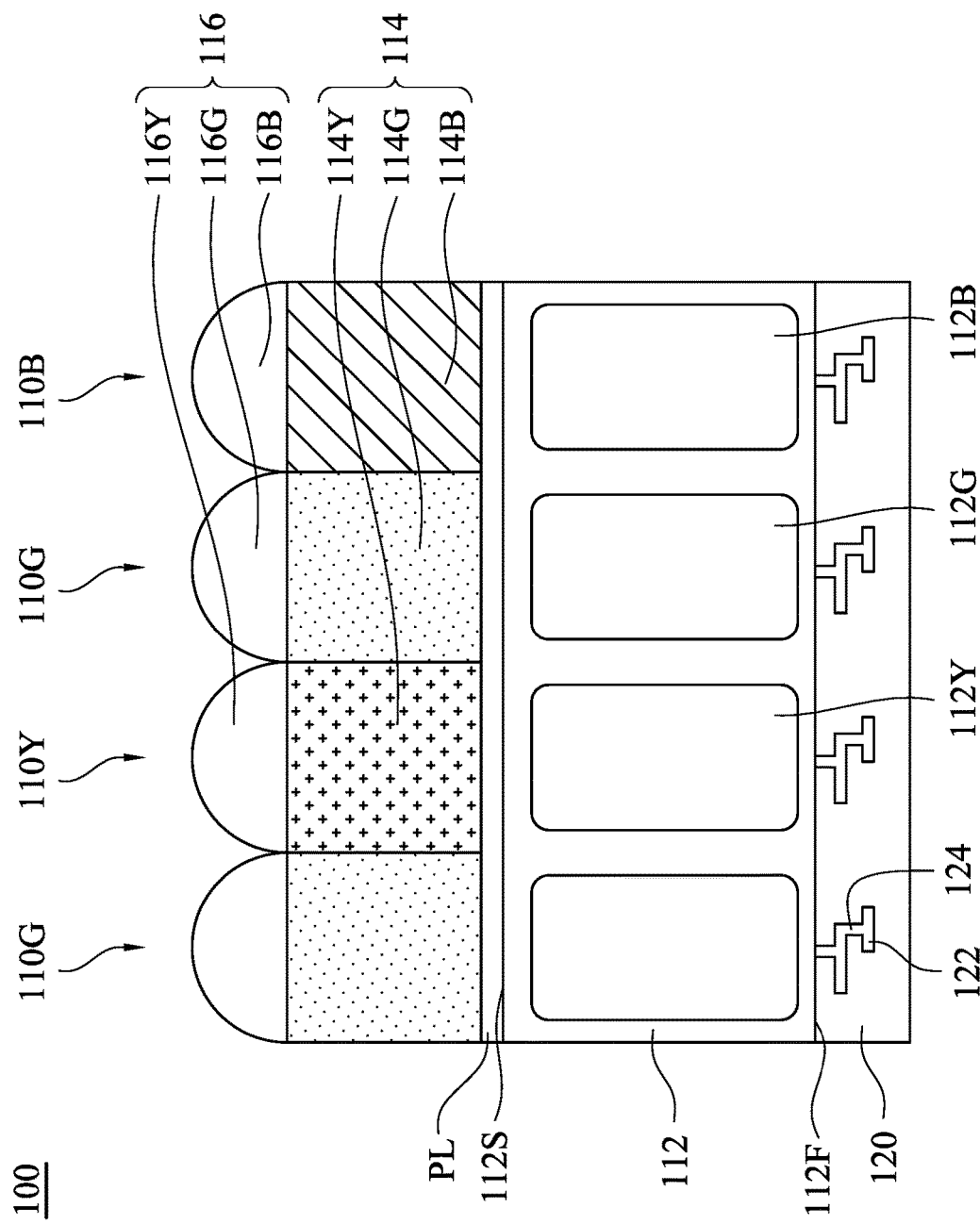
FIG. 1B is a schematic cross-sectional view taken along line 1B-1B pf FIG 1A.

FIG 1A is a schematic top view of an array of image sensor pixels of an image sensor 100 according to some embodiments of the present disclosure. FIG 1B is a schematic cross-sectional view taken along line 1B-1B of FIG. 1A. The image sensor 100 included a semiconductor substrate 112, a color filter array 114, and a lens array 116, and thereby forma an array of image sensing pixels. The semiconductor substrate 112 includes a light receiving element configured to convert incident light collected by lens array 116 and transmitted by the color filter array 114 into electric signals. The color filter array 114 may be a mosaic pattern including plural repeating unit cells RC. In the present embodiments, the unit cell RC includes two-by-two filters, including color filters 114Y, 114G, 114B. Herein, the color filter 114Y is a yellow color filter, the color filter 114G is a green color filter, and the color filter 114B is a blue color filter. The unit cell RC does not include a red filter.

Herein, the light receiving element of the semiconductor substrate 112 may be an array of photosensitive elements 12Y, 112G, 112B, and the lens array 116 includes arrayed micro lenses 116Y, 116G, 116B. The color filters 114Y, 114G, 114B of the color filter array 114, and the micro lenses 116Y, 116G, 116B are disposed corresponding to the photosensitive elements 112Y, 112G, 112B respectively. In some embodiments of the present disclosure, the semiconductor substrate 112 has a front side 112F and a backside 112S for receiving light, and the color filter array 114 is disposed between the backside 112S of the semiconductor substrate 112 and the lens array 116, such that light incident into the image sensor 100 may be collected by the lens array 116, filtered by the color filter array 114, and then transmitted to the photosensitive elements 112Y, 112G, 112B.

Through the configuration, the photosensitive elements 112Y, 112G, 112B, the color filter array 114, and the lens array 116 form an array of image sensing pixels including image sensing pixels 110Y, 110G, and 110B. For example, at least one of the image sensing pixels 110Y includes the photosensitive element 112Y, the color filter 114Y, and the micro lens 116Y, at least one of the image sensing pixels 110G includes the photosensitive element 112G, the color filter 114G, and the micro lens 116G, and at least one of the third image sensing pixels 110B includes the photosensitive element 112B, the color filter 114B, and the micro lens 116B. Through the configuration, light incident into the image sensing pixels 110Y, 110G, and 110B may be respectively collected by the micro lenses 116Y, 116G, and 116B, respectively filtered by the color filters 114Y, 114G, and 114B, and then respectively transmitted to the photosensitive elements 112Y, 112G, 112B. Herein, depending on the color filters 114Y, 114G, 114B, the image sensing pixels 110Y are sensitive to yellow light, the image sensing pixels 110G are sensitive to green light, and the image sensing pixels 110B are sensitive to blue light. Accordingly, the image sensor 100 detects light in blue, green, and yellow channels.

In some embodiments of the present disclosure, the yellow light is considered as a combination of red light and green light, and the image sensing pixels 110Y are sensitive to both the red light and green light. In some embodiments of the present disclosure, the array of image sensing pixels does not include an image sensing pixel only sensitive to red light.

In some embodiments, the photosensitive elements 112Y, 112G, 112B may be photodiodes. Herein, the photosensitive elements 112Y, 112G, 112B may be formed in the semiconductor substrate 112 by implantation. For example, N+ implants, array-N-well implants, and deep-array-N-well implants may be performed. In some embodiments, the photosensitive elements 112Y, 112G, 112B may be complementary metal oxide-semiconductor (CMOS) sensors. Furthermore, the image sensor 100 may be backside illuminated (BSI) complementary metal-oxide semiconductor image sensor (CIS).

The semiconductor substrate 112 is made of a semiconductor material, such as silicon. In some embodiments, the semiconductor substrate 112 may be a silicon substrate doped with P-type dopants such as boron, in which case the semiconductor substrate 112 is a P-type substrate. Alternatively, the semiconductor substrate 112 may be another suitable semiconductor material. For example, the semiconductor substrate 112 may be a silicon substrate that is doped with N-type dopants such as phosphorous, arsenic, or antimony, in which case the semiconductor substrate 112 is an N-type substrate. The semiconductor substrate 112 may include other elementary semiconductors such as germanium and diamond. The semiconductor substrate 112 may optionally include a compound semiconductor and/or an alloy semiconductor. Furthermore, the semiconductor substrate 112 may include an epitaxial layer (epi layer), may be strained for performance enhancement, and may include a silicon-on-insulator (SOI) structure.

In some embodiments of the present disclosure, the image sensor 100 may further include a passivation layer PL disposed on the backside 112S of the semiconductor substrate 112. The passivation layer PL may protect the semiconductor substrate 112 and provide a planar surface, such that the color filter array 114 may be formed on the planar surface of the passivation layer PL.

In some embodiments of the present disclosure, the color filter 114Y transmits light in a wavelength of about 480 to about 630 nanometers, but blocks some or all visible light out of the wavelength range. Also, the color filter 114G transmits light in a wavelength of about 480 to about 580 nanometer, but blocks some or all visible light out of the wavelength range. Also, the color filter 114B transmits light in a wavelength of about 430 to about 480 nanometers, but blocks some or all visible light out of the wavelength range. In some embodiments of the present disclosure, a transmittance of the color filters greater than about 70% may be considered as "transmit", while a transmittance of the color filters less than about 30 may be considered as "block". It is noted that the numerical value should not limit the scope of the present disclosure, and the wavelength ranges of the red, green, and blue light transmitted by the color filter array 114 may be adjusted and chosen upon circumstances.

Herein, for a light incident on the color filter array 114, the color filters 114Y, 114G, and 114B respectively transmit parts of the light. To be specific, the color filter 114Y transmits a red component and a green component of the incident light, but blocking some or all the other component of the incident light (i.e., the blue component). The color filter 114G transmits the green component of the incident light, but blocking some or the other component of the incident light (i.e., the red component and the blue component). The color filter 114B transmits a blue component of the incident light, but blocking some or all the other component of the incident light (i.e., the red component and the green component).

In some embodiments of the present disclosure, the photosensitive elements 112Y, 112G, 112B have substantially the same sizes and are made of the same material, and the photosensitive elements 112Y, 112G, 112B may have the same spectral response (or quantum efficiency (QE)). The color filters 114Y, 114G, 114B may be arranged according to the configuration of the photosensitive elements 112Y, 112G, 112B, and sizes of the color filters 114Y, 114G, 114B are substantially the same. In other embodiments, sizes of the photosensitive elements 112Y, 112G, 112B may be different from each other, and sizes of the color filters 114Y, 114G, 114B may be different from each other.

In some embodiments, the micro lenses 116Y 116G, 116B may be arranged according to the configuration of the photosensitive elements 112Y, 112G, 112B, and the micro lenses 116Y, 116G, 116B may have substantially the same structures. In other embodiments, the micro lenses 116Y. 116G, 116B may have different structures from each other. In some embodiments, the micro lenses 116Y, 116G, 116B are convex lenses. In some embodiments, each micro lenses 116Y, 116G, 116B has a plano-convex shape.

In some embodiments of the present disclosure, the image sensor 100 may further include an interconnect structure 120 disposed at the front side 112F of semiconductor substrate 112 and a processing circuitry 130. The image sensing pixels 110Y, 110G, and 110B are electrically connected with the processing circuitry 130 through the interconnect structure 120. The interconnection structure 120 may include a number of patterned dielectric layers and conductive layers that couple to various doped features, circuitry, and input/output of the photosensitive elements 112Y, 112G, 112B. The interconnection structure 120 includes an interlayer dielectric (ILD) and a multilayer interconnection (MLI) structure. The MLI structure includes contacts, vias and metal lines. For the purpose of illustration, a number of conductive lines 122 and vias/contacts 124 are shown in FIG. 1B. It being understood that the conductive lines 112 and vias/contacts 124 are exemplary. The actual positioning and configuration of the conductive lines 112 and vias/contacts 124 may vary depending on design needs and manufacturing concerns. Through the configuration, electric signals converted from the incident light by the photosensitive elements 112Y, 112G, 112B can be conveyed to the processing circuitry 130 by the interconnect structure 120.

In some embodiments, because of the properties of the photosensitive elements 112Y, 112G, 112B and the color filters 114Y, 114G, and 114dB, the spectral sensitivity functions (or spectral responsivity) of the 3 color channels in the image sensor 100 may not match those of the desired output color space (e.g. CIE-XYZ, sRGB, National Television System Committee (NTSC)). Thus, color correction is performed to transform the raw color images into the desired color space through a color correction circuit in the processing circuitry 130. Color correction may be implemented with the following 3×3 color correction matrix (CCM) multiplication in Equation (1):

$$\begin{bmatrix} A' \\ B' \\ C' \end{bmatrix} = \begin{bmatrix} D_A & \alpha & \beta \\ \gamma & D_B & \delta \\ \varepsilon & \varphi & D_C \end{bmatrix} \begin{bmatrix} A \\ B \\ C \end{bmatrix} \quad \text{Equation (1)}$$

Herein, A, B, and C represents the electric signals detected by image sensors in their color channels, and A', B', and C' are color-corrected red, green, and blue signals in the output color space. The elements $D_A$, $D_B$, $D_C$, α, β, γ, δ, ε, and φ of the CCM depend on the spectral response of the photosensitive elements and the color filters. There are a variety of methods to obtain the elements of the CCM. For example, one method to obtain the elements of the CCM is to optimize the matrix based on the detected yellow, green, and blue electric signals (i.e. A, B, and C in Equation (1)) to minimize the color error in the color-corrected red, green, and blue. The color error may be the difference between the ideal and color-corrected red, green, and blue data, in which the ideal red, green and blue data are related to the response of human eye to color. For example, the optimization may be performed by solving the least-squares problem that minimizes the sum-of-squared-difference between the ideal and color-corrected spectral sensitivity function.

In some embodiments, when color correction is applied, noise also goes through the matrix multiplication and the noise variance (ΔY) is changed. For example, for a silicon-based image sensor, the noise variance (ΔY) obtained by optimized the color correction matrix may be denoted as follows:

$$\Delta Y^2 = (0.299 D_A + 0.587\gamma + 0.114\varepsilon)^2 \Delta A^2 + (0.299\alpha + 0.587 D_B + 0.114\varphi)^2 \Delta B^2 + (0.299\beta + 0.587\delta + 0.114 D_C)^2 \Delta C^2 \quad \text{Equation (2)}$$

In some circumstances, although the 3×3 CCM multiplications minimizes the color error in the color-corrected red, green, and blue data, the 3×3 CCM multiplication can amplify the noise variance (ΔY). For example, in a RGB detecting system, A, B, and C are associated with red, green, and blue electric signals respectively, which are detected by image sensing pixels having red, green, and blue color filters respectively. The detected red, green, and blue electric signals are transformed into color-corrected red, green, and blue data by its CCM. However, when color correction is applied, the values of the elements $D_A$, $D_B$, and $D_C$ of the CCM in the RGB detecting system are quite apart, and therefore the noise variance (ΔY) is large.

In some embodiments of the present disclosure, for reducing the noise variance (ΔY), a YGB detecting system is used. FIG. 2 is a flow chart of an image processing method 200 according to some embodiments of the present disclosure. Reference is made to FIG. 1A and FIG. 2. At step 210, the image sensor 100 mat receive a light and convert the light into at least yellow, green, and blue electric signal by the image sensor 100. In some embodiments, the light may be a visible light coming from an object or an image and impinging on the image sensing pixels 110Y, 110G, and 110B. As illustrated above, the image sensing pixels 110Y, 110G, and 110B are sensitive to yellow, green, and blue light respectively. Therefore, a green component and a red component of the light is converted into the yellow electric signal by the image sensing pixel 110Y, the green component of the light is converted into the green electric signal by the image sensing pixel 110G, and a blue component of the light is converted into the blue electric signal by the image sensing pixel 110B, Herein, the yellow, green, and blue electric signals are associated with A, B, and C respectively in Equation (1).

At step 220, information associated the yellow, green, and blue electric signals are processed, so as to obtain a CCM herein. As mentioned above, the CCM is a result of optimization. For example, the CCM may be obtained by solve the least-squares problem that minimizes the sum-of-squared-difference between the ideal and color-corrected spectral sensitivity function.

At step 230, a set of a red image data, a green image data, and a blue image data are determined based on the information associated with the yellow, green, and blue electric signal. For example, the yellow, green, and blue electric signals may be multiplexed by the color correction matrix, so as to obtain color-corrected red, green, and blue data. Thus, the detected yellow, green, and blue electric signals (i.e. A, B, and C in Equation (1)) are transformed to color-corrected red, green, and blue data (i.e. A', B', and C' in Equation (1)) by its CCM. The CCM of the TGB detecting system is different from the CCM of the RGB detecting system. Through the configuration, the values of the elements $D_A$, $D_B$, and $D_C$ of the CCM of the YGB detecting system are close, and therefore the noise variance (ΔY) is small.

Figure 3:
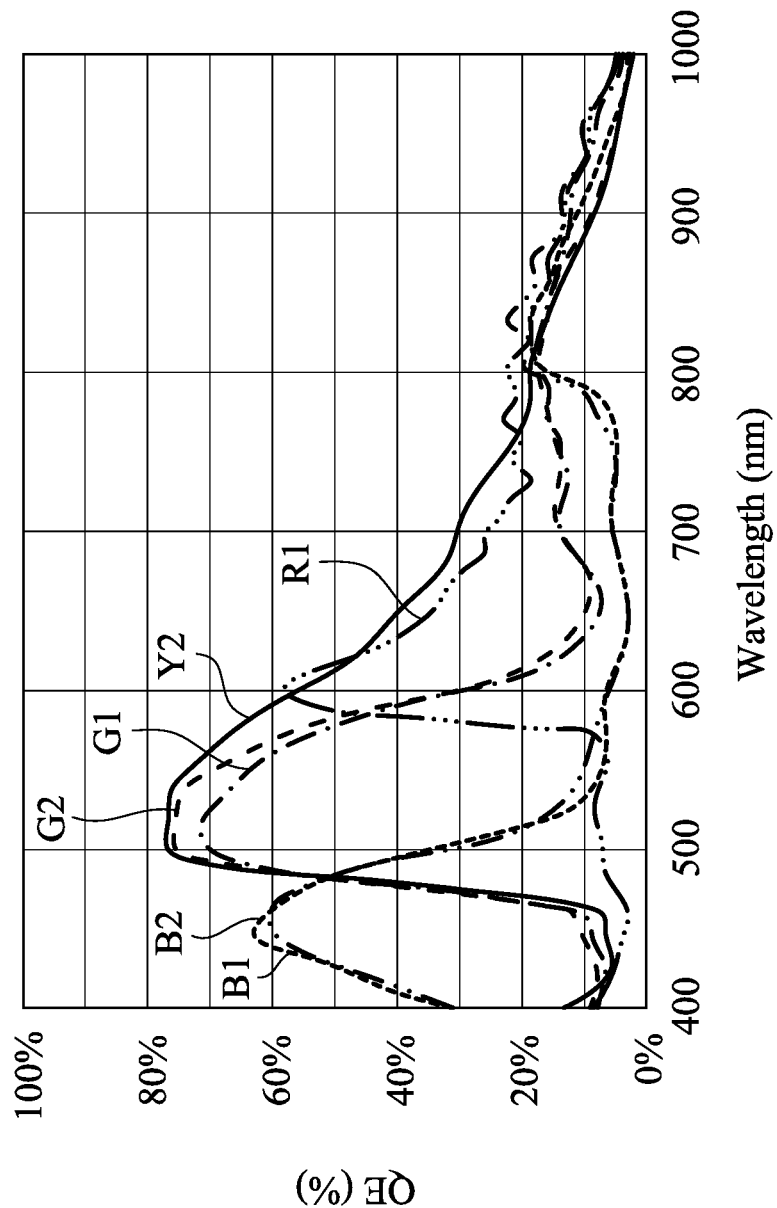
FIG. 3 shows a simulation result of spectral response of plural image sensor pixels of image sensors according to some embodiments of the present disclosure.

FIG. 3 shows a simulation result of spectral response of plural image sensing pixels of image sensors according to some embodiments of the present disclosure. The dash-dotted lines R1, G1, and B1, indicate the spectral response of the image sensing pixels having the red, green, and blue color filter respectively in the RGB detecting system, while the solid line Y2, and the dashed lines G2, and B2, indicate the spectral responses of the image sensing pixels 110Y, 110G, and 110B of the image sensor 100 in the YGB detecting system. The image sensing pixels 110Y having the yellow color filter has a spectral response covers that of the image sensing pixel having the red color filter and the image sensing pixel having the green color filter (i.e., the solid line Y2 covers the dash-dotted lines R1 and G1), and thus the first image sensing pixels 110Y produces signal (which may be the value A) in response to red light and green light. In some embodiments, the image sensing pixels 110Y have greater spectral response (or quantum efficiency) than that of the image sensing pixel having the red color filter (i.e., QE of the solid line Y2 is greater than QE of the dash-dotted one R1). For example, the spectral response at the wavelength of 560 to 600 nanometers of the image sensing pixels 110Y is greater than that of the image sensing pixel having the red color filter. In some embodiments, the image sensing pixels 110Y have greater spectral response (or quantum efficiency) than that of the image sensing pixel having the green color filter or the image sensing pixels 110G. For example, a transmittance of the color filter 114Y of the image sensing pixels 110Y transmit the green light (e.g., light in a wavelength of about 480 to about 580 nanometers) is greater than a transmittance of the color filter 114G of the image sensing pixels 110G transmit the green light (i.e., QE of the solid line Y2 is greater than QE of the dash line G2). Therefore, in the TGB detecting system, the intensity of the detected signals (which may be the value A) is enhance.

Reference is made to FIG. 1A. In present embodiments, the color filter array 114 does not include a red color filter, which transmits red light, but blocks some or all blue light and green light, such that the array of image sensors does not include an image sensing pixel only sensitive to red light. Through the configuration, the signals produced by the image sensor 100 are processed by the CCM in the TGB detecting system, instead of being processed by the CCM in the RGB detecting system. Therefore, the noise variance is small and the intensity of the signals is enhanced.

In some embodiments of the present disclosure, the number of the image sensing pixels 110G is twice the number of the image sensing pixels 110Y or the number of the image sensing pixels 110B, so as to mimic the physiology of the human eye. Herein, the unit cell RC includes a two-by-two color filters, such that the mosaic pattern includes a two-by-two image sensing pixels, with two image sensing pixels 110G diagonally opposite one another, along with the image sensing pixels 110Y and the image sensing pixels 110B that are diagonally opposite one another. However, it should not limit the scope of the present disclosure. In some other embodiments, the image sensing pixels may be configured with various kinds of mosaic patterns according to application requirements.

Figure 4:
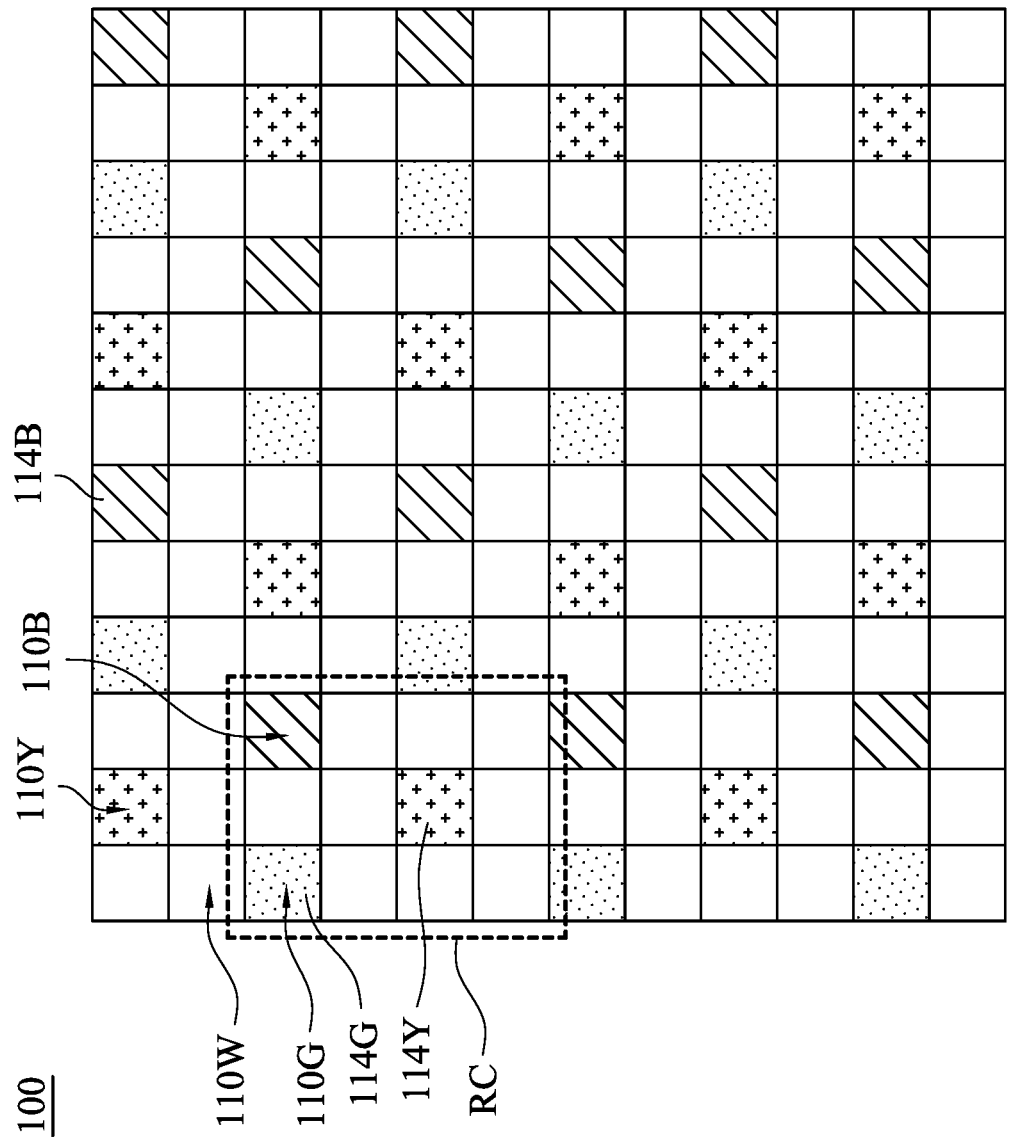
FIG. 4 is a schematic top view of an image sensor according to some embodiments of the present disclosure.

FIG. 4 is a schematic top view of an image sensor 100 according to some embodiments of the present disclosure. The present embodiments are similar to the embodiments of FIG. 1A and FIG. 1B, and the difference between the present embodiments and the embodiments of FIG. 1A and FIG. 1B is that the image sensor 100 further includes image sensing pixels 110W. Herein, the image sensing pixels 110W may not include a visible color filter, such that the image sensing pixels 110W are sensitive to lights depending on the property of the photosensitive elements. That is, the image sensing pixels 110W are clear, or otherwise known as panchromatic pixels. In some embodiments, the image sensing pixel 110W may also include the photosensitive elements and the micro lenses, as structure of the image sensing pixels 110Y, 110G, and 110B.

In the present embodiments, the number of the image sensing pixels 110W is greater than a sum of the number of the image sensing pixels 110Y, 110G, and 110B, and the image sensing pixels 110Y, 110G, and 110B are distributed in an approximate triangular array, with most pixels unfiltered. However, it should not limit the scope of the present disclosure. In some other embodiments, the number of the image sensing pixels 110W may be smaller than a sum of the number of the image sensing pixels 110Y, 110G, and 110B. Other details of the present embodiments are substantially the same as the embodiments of FIG. 1A and FIG.1B, and not repeated herein.

Figure 5:
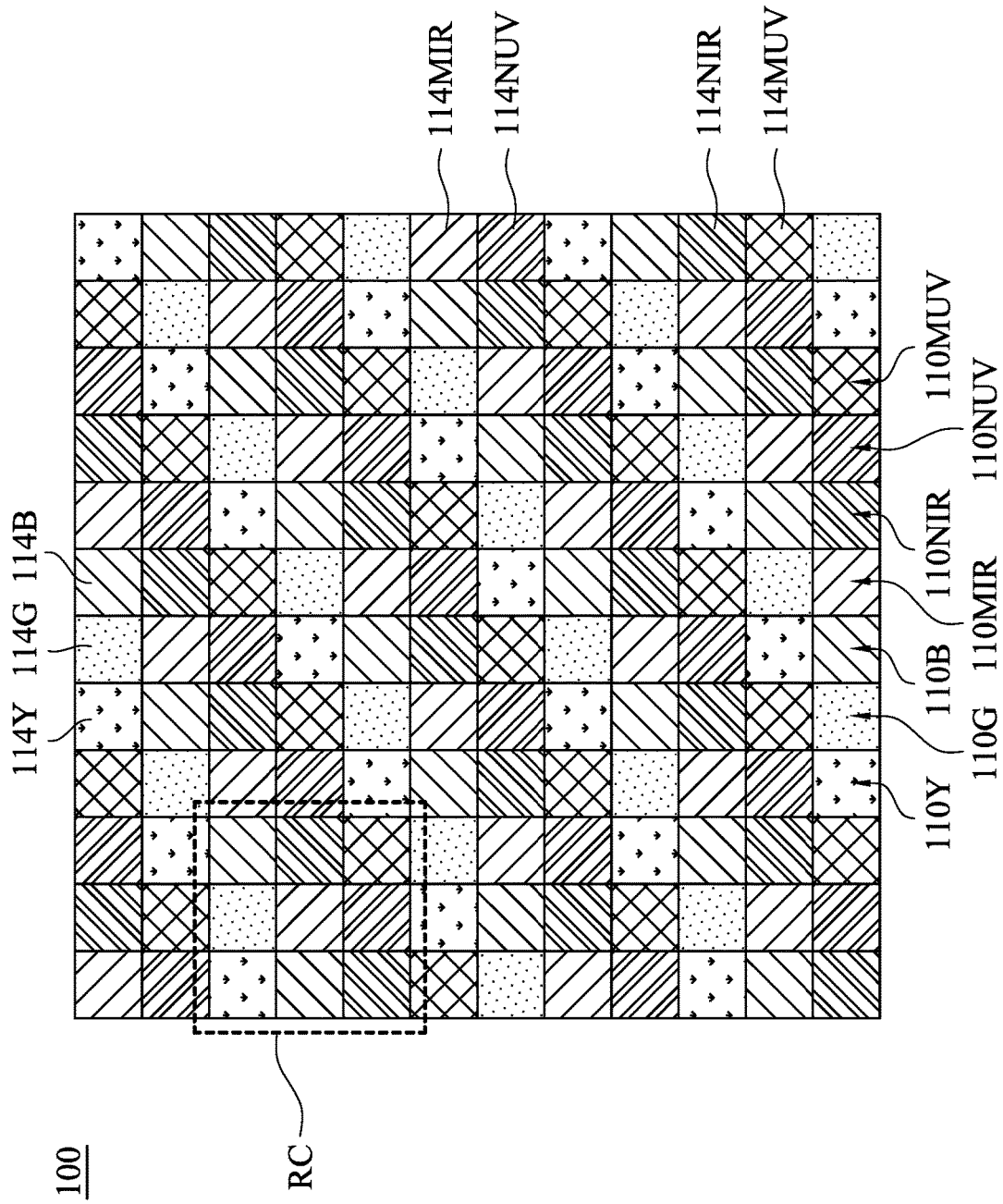
FIG. 5 is a schematic top view of an image sensor according to some embodiments of the present disclosure.

FIG.5 is a schematic top view of an image sensor 100 according to some embodiments of the present disclosure. The present embodiments are similar to the embodiments of FIG. 1A and FIG. 1B, and the difference between the present embodiments and the embodiments of FIG. 1A and FIG. 1B is that the image sensor 100 further includes image sensing pixels 110MIR, 110NIR, 101NUV, and 110MUV. The image sensing pixels 110MIR, 110NIR, 110NUV, and 110MUV are respectively sensitive to medium infrared red light, near infrared red light, near ultra-violet light, and medium ultra-violet light. Through the configuration, the image sensor 100 may detects seven, colors, and may be useful in astronomy.

The image sensing pixels 110MIR, 110NIR, 110NUV, and 110MUV may include color filters 114MIR, 114NIR, 114NUV, and 114MUV. The color filters 114MIR. 114NIR, 114NUV, and 114MUV may transmit the medium infrared red light, the near infrared red light, the near ultra-violet light, and the medium ultra-violet light, but block the red, green, and blue light, which can be transmitted by the color filters 114Y, 114G, 114B. In some embodiments, the image sensing pixels 110MIR, 110NIR, 110NUV, and 110MUV also include the photosensitive elements and the micro lenses, as structure of the image sensing pixels 110Y, 110G, and 110B. Other details of the present embodiments are substantially the same as the embodiments of FIG. 1A and FIG. 1B, and not repeated herein.

Figure 6:
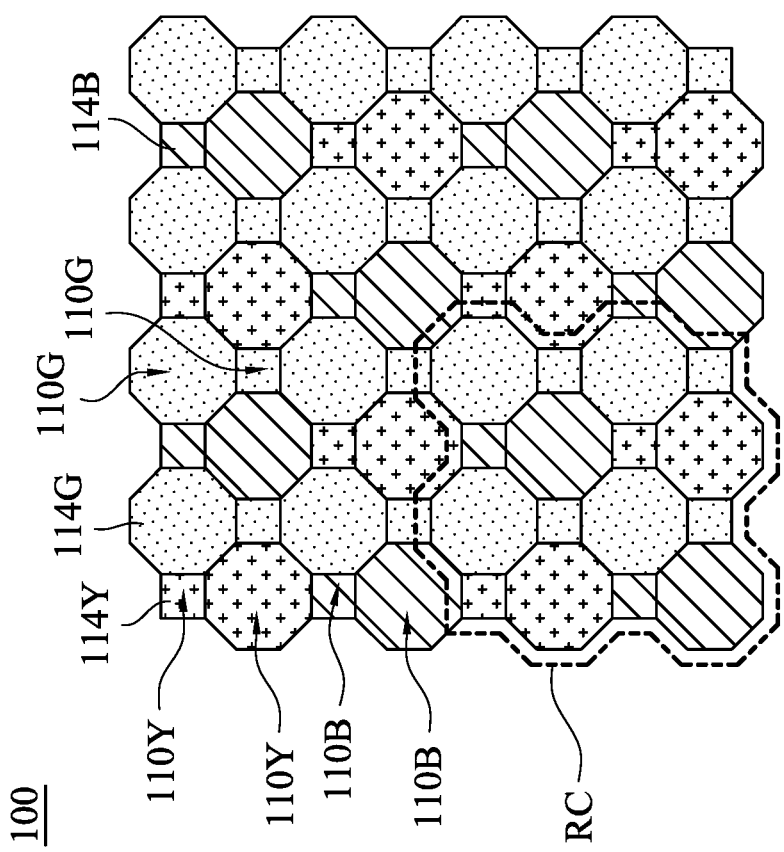
FIG. 6 is a schematic top view of an image sensor according to some embodiments of the present disclosure.

FIG. 6 is a schematic top view of an image sensor 100 according to some embodiments of the present disclosure. The present embodiments are similar to the embodiments of FIG. 1A and FIG. 1B, and the difference between the present embodiments and the embodiments of FIG. 1A and FIG. 1B is that the image sensor 100 includes image sensing pixels 110Y of different sizes, image sensing pixels 110G of different sizes, and image sensing pixels 110B of different sizes.

In the present embodiments, the image sensing pixels 110Y have two sizes, the image sensing pixels 110G have two sizes, and the image sensing pixels 110B have two sizes. In the present embodiments, the large sensor pixels are octagonal, and smaller square pixels are placed in the square areas between the large sensor pixels. Through the configuration, if an image is slightly overexposed, so that the larger sensor pixels are saturated, an image with proper contrast can be obtained from the smaller pixels.

In the present embodiments, a portion of the image sensing pixels 110G are arranged in one column, and a portion of the image sensing pixel 110Y and 110B are interlaced in another column. Through the configuration, as illustrated previously, the number of the image sensing pixels 110G is twice the number of the image sensing pixels 110Y or the number of the image sensing pixels 110B, so as to mimic the physiology of the human eye.

Other details of the present embodiments are substantially the same as the embodiments of FIG. 1A and FIG. 1B, and not repeated herein.

Figure 7:
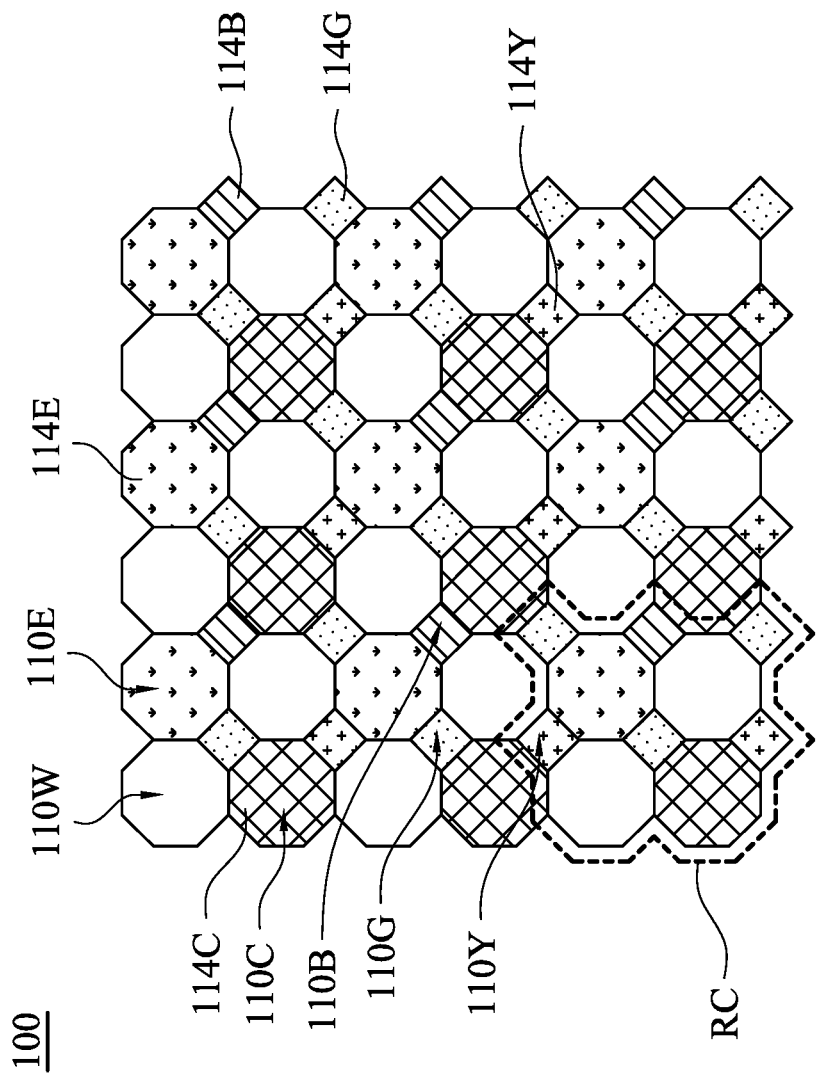
FIG. 7 is a schematic top view of an image sensor according to some embodiments of the present disclosure.

FIG. 7 is a schematic top view of an image sensor 100 according to some embodiments of the present disclosure. The present embodiments are similar to the embodiments of FIG. 1A and FIG. 1B, and the difference between the present embodiments and the embodiments of FIG. 1A and FIG, 1B is at least that the image sensor 100 further includes image sensing pixels 110W, 110C, and 110E. In the present embodiments, the image sensing pixels 110W may not include a color filter, such that the image sensing pixels 110W are sensitive to lights depending on the property of the photosensitive elements. That is, the image sensing pixels 110W are clear, or otherwise known as panchromatic pixels. In the present embodiments, the image sensing pixels 110C may include cyan color filters 114C, and the image sensing pixels 110E may include yellow color filters 114E. The color filters 114C and 114E transmit cyan and yellow light respectively. In some embodiments, the image sensing pixels 110W, 110C, and 110E may also include the photosensitive elements and the micro lenses, as structure of the image sensing pixels 110Y, 110G, and 110B.

In some embodiments of the present embodiments, the yellow color filters 114E of the image sensing pixels 110E and the yellow color filters 114Y of the image sensing pixels 110Y may be made of the same materials. That is, for a unit cell RC, the yellow color filters 114E of the image sensing pixels 110E and the yellow color filters 114Y of the image sensing pixels 110Y may have substantially the same transmittance spectrum.

The sizes of the image sensing pixels 110W, 110C. and 110E are different from the sizes of the image sensing pixels 110Y, 110G. and 110B. Herein, the sizes of the image sensing pixels 110Y, 110G, and 110B are smaller than the sizes of the image sensing pixels 110W, 110C. and 110E. To be specific, the large image sensing pixels 110W, 110C, and 110E were octagonal, and smaller square image sensing pixels 110Y, 110G, and 110B were placed in the square areas between the large sensor pixels. Through the configuration, if an image is slightly overexposed, so that the larger sensor pixels are saturated, an image with proper contrast can be obtained from the smaller pixels. Furthermore, the difference in sizes could be augmented by the use of a yellow/cyan/unfiltered array for the large pixels, that lets in more light, and a yellow/blue/green/ array, letting in less light for the small pixels.

In the present embodiments, the lens array 116 (see FIG. 1B) includes plural octagonal micro lenses corresponding to the image sensing pixels 110W, 110C, and 110E. while leaving the image sensing pixels 110Y, 110G, and 110B without micro lenses.

Other details of the present embodiments are substantially the same as the embodiments of FIG. 1A, FIG. 1B, and FIG. 5, and not repeated herein.

Figure 8A:
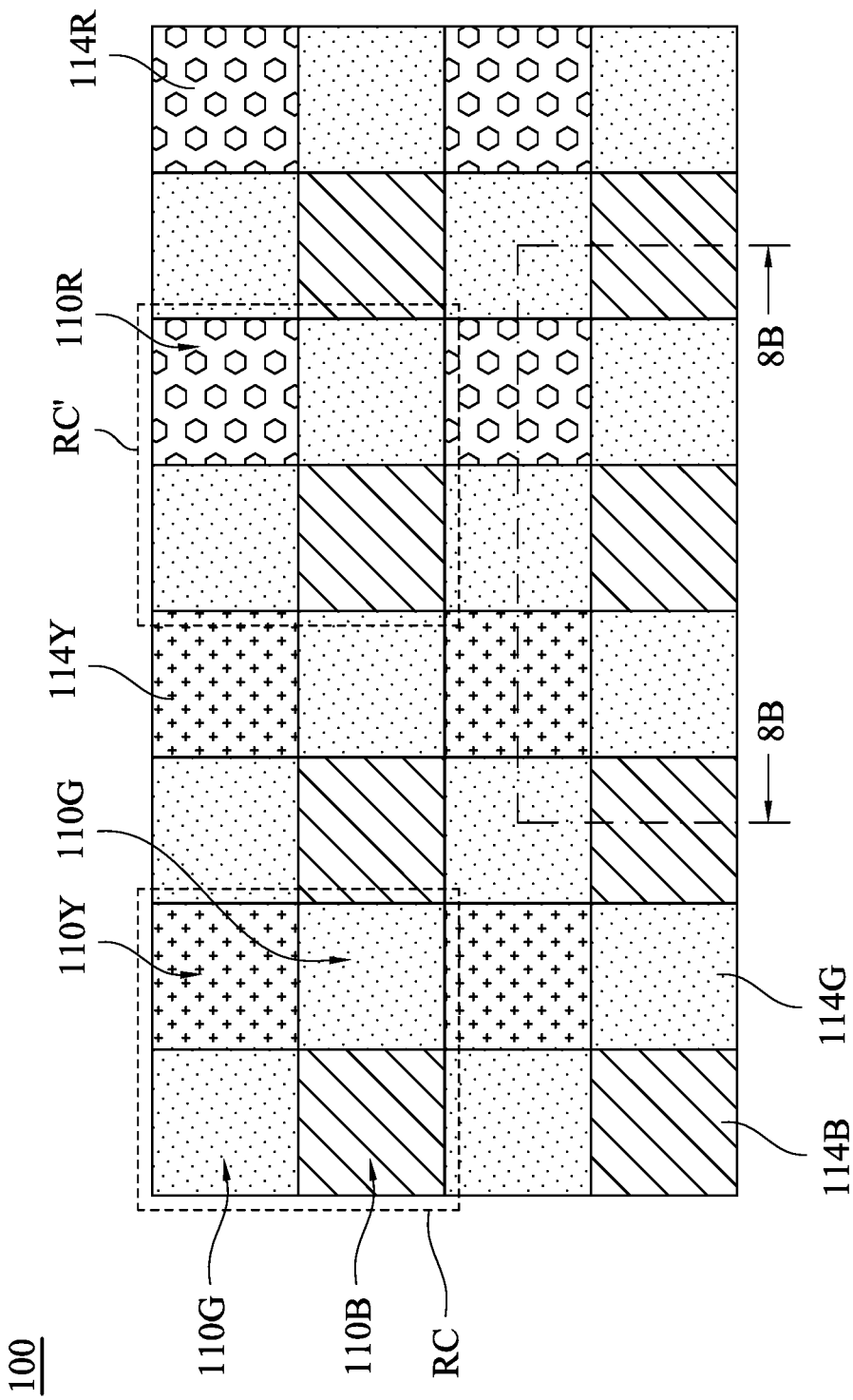
FIG. 8A is a schematic top view of an image sensor according to some embodiments of the presents disclosure.
Figure 8B:
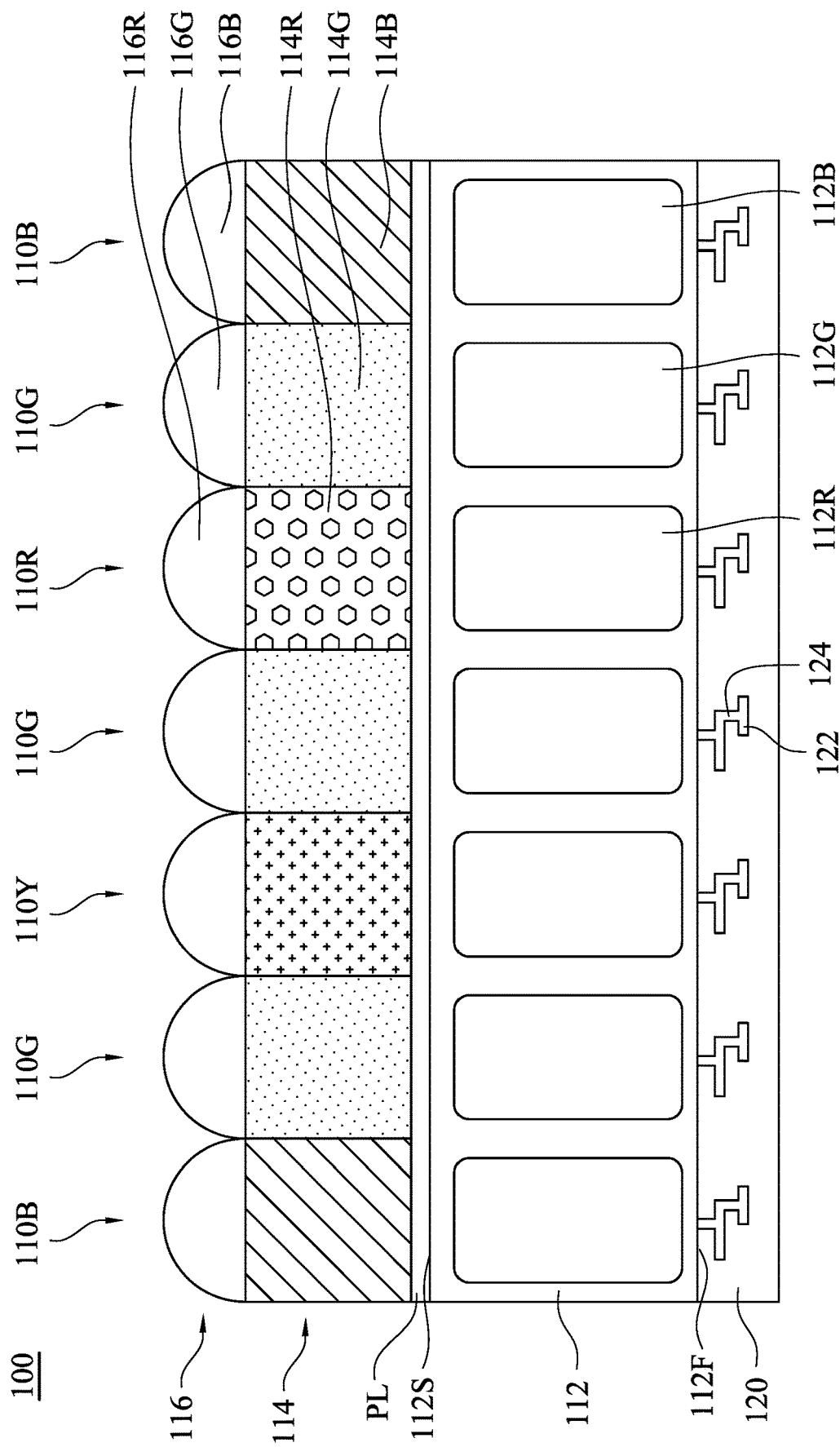
FIG. 8B is a schematic cross-sectional view taken along line 8B-8B of FIG 8A.

FIG. 8A is a schematic top view of an image sensor 100 according to some embodiments of the present disclosure. FIG. 8B is a schematic cross-sectional view taken along line 8B-8B of FIG. 8A. The present embodiments are similar to the embodiments of FIG. 1A and FIG. 1B, and the difference between the present embodiments and the embodiments of FIG. 1A and FIG.1B is at least that a first portion of the color filter array 114 includes repeating unit cells RC, and a second portions of the color filter array 114 includes another repeating unit cells RC'.

In the present embodiments, the unit cell RC' may include color filters 114R, 114G, and 114B, while the unit cell RC includes the color filters 114Y, 114G, and 114B. The red color filter 114R transmits red light, but blocking some or all blue and green light. Therefore, image sensing pixels 110R including the color filter 114R is sensitive to red light. In some embodiments, the image sensing pixel 110R may also include a photosensitive element 112r and a micro lens 116R, as the structure of the image sensing pixels 110B and 110G.

Herein, the unit cells RC and the unit cells RC' have the same pattern, and the color filters 114Y of the unit cell RC is at a first location of the pattern, and the color filters 114R of the unit cell RC' is also at a first location of the pattern, In some embodiments, the color filters 114G of the unit cell RC and the color filters 114G of the unit cell RC' are both at a second location of the pattern. In some embodiments, the color filters 114B of the unit cell RC and the color filters 114B of the unit cell RC' are both at a second location of the pattern. The color filters 114G and 114B of the unit cell RC' may be substantially the same as that of the color filters 114G and 114B of the unit cell RC.

In the present embodiments, the image sensor 100 is implemented with both the YGB and the RGB detecting systems. Herein, the first portion of the color filter array 114 including the unit cells RC is associated with the YGB detecting systems, while the second portion of the color filter array 114 including the unit cells RC' is associated with the RGB detecting systems. Through the configuration, when light is incident onto the color filter array 114, a first portion of the light is converted into the yellow, green, and blue electric signals by the image sensing pixels 110Y, 110G, and 110G within the unit cells RC, while a second portion of the light is converted into the red, green, and blue electric signals by the image sensing pixels 110R, 110G. and 110G within the unit cells RC' . To be specific, yellow (i.e., a combination of red and green), green, blue components of the first portion of the light are converted into the yellow, green, and blue electric signals respectively, while red, green, blue components of the second portion of the light are converted into the red, green, and blue electric signals respectively.

The information associated with the yellow, green, and blue electric signals detected by the image sensing pixels 110Y, 110G, and 110G within the unit cells RC is processed to obtain a first color correction matrix, and the information associated with the red, green, and blue electric signals detected by the image sensing pixels 110R, 110G. and 110G within the unit cells RC' is processed to obtain a second color correction matrix. A first set of a red image data, a green image data, and a blue image data are determined based on the information associated with the yellow, green, and blue electric signals detected by the image sensing pixels 110Y, 110G, and 110G within the unit cells RC, while a second set of a red image data, a green image data, and a blue image data are determined based on the information associated with the red, green, and blue electric signal detected by the image sensing pixels 1101R, 110G, and 110G within the unit cells RC' . Through the configuration, some of the signals produced by the image sensor 100 are processed by the CCM in the TGB detecting system, while some of the signals produced by the image sensor 100 are processed by the CCM in the RGB detecting system.

Other details of the present embodiments are substantially the same as the embodiments of FIG. 1A and FIG. 1B, and not repeated herein.

In some embodiments of the present disclosure, the image sensor 100 detects light in the yellow, green, and blue color channels, so that the spectrum response of the image sensor 100 is enhanced and when the raw color images is transformed into the desired color space through a color correction, the noise variance ($\Delta Y$) is reduced.

According to some embodiments of the present disclosure, the image sensor includes a color filter array and a light receiving element. The color filter array includes plural repeating unit cells, the repeating unit cells including first, second, and third unit cells. The first and second unit cells are adjacent to each other in a first direction, the second and third unit cells are adjacent to each other in a second direction transverse to the first direction. Each of the first, second, and third unit cells includes at least one first yellow filter configured to transmit a green component and a red component of incident light, and each of the first, second, and third unit cells does not comprise a red filter configured to transmit the red component of the incident light. The light receiving element is configured to convert the incident light transmitted by the color filter array into electric signals.

According to some embodiments of the present disclosure, an image sensor includes a color filter array and a light receiving element. The color filter array includes plural repeating unit cells, the repeating unit cells including first, second, and third unit cells. The first and second unit cells are adjacent to each other in a first direction, the second and third unit cells are adjacent, to each other in a second direction transverse to the first direction. Each of the first, second, and third unit cells includes at least one yellow filter and at least one green filter. The yellow filter is configured to transmit a green component and a red component of incident light, in which the yellow filter is configured to transmit the green component of the incident light with a first transmittance. The green filter is configured to transmit the green component of the incident light with a second transmittance, in which the first transmittance is greater than the second transmittance. The light receiving element is configured to convert the incident light transmitted by the color filter array into electric signals.

According to some embodiments of the present disclosure, an image sensor includes a color filter array and a light receiving element. The color filter array includes repeating unit cells, the repeating unit cells including first, second, and third unit cells. The first and second unit cells are adjacent to each other in a first direction, the second and third unit cells are adjacent to each other in a second direction transverse to the first direction. Each of the first, second, and third unit cells includes a first filter, a second filter, and a third filter. The first filter is configured to transmit a first component of incident light and block a second component and a third component of the incident light. The second filter is configured to transmit the first component and the second component of the incident light and block the third component of the incident light. The third filter is configured to transmit the third component of the incident light and block the first and second components of the incident light. Each of the first, second, and third unit cells does not include a filter configured to transmit the second component of the incident light and block the first and third components of the incident light. The light receiving element is configured to convert the incident light transmitted by the color filter array into electric signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   a color filter array, comprising a plurality of repeating unit cells, the plurality of repeating unit cells comprising first, second, and third unit cells,
   wherein the first and second unit cells are adjacent to each other in a first direction, the second and third unit cells are adjacent to each other in a second direction transverse to the first direction, and each of the first, second, and third unit cells comprises at least one first yellow filter configured to transmit a green component and a red component of incident light, and each of the first, second, and third unit cells does not comprise a red filter configured to transmit the red component of the incident light; and
   a light receiving element configured to convert the incident light transmitted by the color filter array into electric signals.

2. The image sensor of claim 1, wherein each of the first, second, and third unit cells further comprises at least one green filter configured to transmit the green component of the incident light.

3. The image sensor of claim 2, wherein a size of the first yellow filter is equal to a size of the green filter.

4. The image sensor of claim 2, wherein the number of a plurality of the green filters of one of the first, second, and third unit cells is twice the number of the at least one first yellow filter of the one of the first, second, and third unit cells.

5. The image sensor of claim 2, wherein the number of the at least one green filter of one of the first, second, and third unit cells is equal to the number of the at least one first yellow filter of the one of the first, second, and third unit cells.

6. The image sensor of claim 2, wherein the first yellow filter is configured to transmit the green component of the incident light with a first transmittance, the green filter is configured to transmit the green component of the incident light with a second transmittance, and the first transmittance is greater than the second transmittance.

7. The image sensor of claim 1, wherein each of the first, second, and third unit cells further comprises at least one blue filter configured to transmit a blue component of the incident light.

8. The image sensor of claim 7, wherein a size of the first yellow filter is equal to a size of the blue filter.

9. The image sensor of claim 1, wherein each of the first, second, and third unit cells further comprises at least one second yellow filter configured to transmit the green component and the red component of incident light, and a size of the first yellow filter is greater than a size of the second yellow filter.

10. An image sensor, comprising:
    a color filter array, comprising a plurality of repeating unit cells, the plurality of repeating unit cells comprising first, second, and third unit cells, wherein the first and second unit cells are adjacent to each other in a first direction, the second and third unit cells are adjacent to each other in a second direction transverse to the first direction, and each of the first, second, and third unit cells comprises:
       at least one yellow filter configured to transmit a green component and a red component of incident light, wherein the yellow filter is configured to transmit the green component of the incident light with a first transmittance; and
       at least one green filter configured to transmit the green component of the incident light with a second transmittance, wherein the first transmittance is greater than the second transmittance; and
    a light receiving element configured to convert the incident light transmitted by the color filter array into electric signals.

11. The image sensor of claim 10, wherein a size of the yellow filter is equal to a size of the green filter.

12. The image sensor of claim 10, wherein the number of the at least one green filter of one of the first, second, and third unit cells is equal to or greater than the number of the at least one yellow filter of the one of the first, second, and third unit cells.

13. The image sensor of claim 10, wherein each of the first, second, and third unit cells does not comprise a red filter configured to transmit the red component of the incident light.

14. An image sensor, comprising:
    a color filter array, comprising a plurality of repeating unit cells, the plurality of repeating unit cells comprising first, second, and third unit cells, wherein the first and second unit cells are adjacent to each other in a first direction, the second and third unit cells are adjacent to each other in a second direction transverse to the first direction, and each of the first, second, and third unit cells comprises:
       a first filter configured to transmit a first component of incident light and block a second component and a third component of the incident light;

a second filter configured to transmit the first component and the second component of the incident light and block the third component of the incident light; and a third filter configured to transmit the third component of the incident light and block the first and second components of the incident light, wherein each of the first, second, and third unit cells does not comprise a filter configured to transmit the second component of the incident light and block the first and third components of the incident light; and a light receiving element configured to convert the incident light transmitted by the color filter array into electric signals.

15. The image sensor of claim 14, wherein a wavelength of the second component of the incident light is longer than a wavelength of the first component of the incident light and a wavelength of the third component of the incident light.

16. The image sensor of claim 14, wherein a wavelength of the first component of the incident light is between a wavelength of the second component of the incident light and a wavelength of the third component of the incident light.

17. The image sensor of claim 14, wherein a wavelength of the first component of the incident light is in a range from 480 nanometers to 580 nanometers, and a wavelength of the first component of the incident light and the second component of the incident light are in a range from 480 nanometers to 630 nanometers.

18. The image sensor of claim 14, wherein the first filter is configured to transmit the first component of the incident light with a first transmittance, the second filter is configured to transmit the first component of the incident light with a second transmittance, and the second transmittance is greater than the first transmittance.

19. The image sensor of claim 14, wherein the light receiving element comprises:

a first photosensitive element configured to convert the first component of the incident light transmitted by the first filter into a first electric signal;

a second photosensitive element configured to convert the first and second components of the incident light transmitted by the second filter into a second electric signal; and a third photosensitive element configured to convert the third component of the incident light transmitted by the third filter into a third electric signal.

20. The image sensor of claim 19, wherein the light receiving element further comprises a fourth photosensitive element configured to receive the first to third components of the incident light.

* * * * *